United States Patent
Liu et al.

(10) Patent No.: US 10,325,663 B1
(45) Date of Patent: Jun. 18, 2019

(54) PROTECTING MEMORY CELLS FROM IN-PROCESS CHARGING EFFECTS

(71) Applicant: Macronix International Co., Ltd., Hsinchu (TW)

(72) Inventors: Yiching Liu, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/857,940

(22) Filed: Dec. 29, 2017

(51) Int. Cl.
*G11C 16/22* (2006.01)
*H01L 21/768* (2006.01)
*H01L 23/528* (2006.01)
*H01L 27/11573* (2017.01)
*H01L 27/02* (2006.01)
*G11C 16/04* (2006.01)
*H01L 27/11526* (2017.01)
*G11C 16/08* (2006.01)

(52) U.S. Cl.
CPC .......... *G11C 16/22* (2013.01); *G11C 16/0483* (2013.01); *H01L 21/76895* (2013.01); *H01L 23/528* (2013.01); *H01L 27/0255* (2013.01); *H01L 27/11526* (2013.01); *H01L 27/11573* (2013.01); *G11C 16/08* (2013.01)

(58) Field of Classification Search
CPC ..... G11C 16/22; G11C 16/0483; G11C 16/08; H01L 27/11526; H01L 27/0255; H01L 23/528; H01L 21/76895; H01L 27/11573
USPC ..................................................... 365/185.05
See application file for complete search history.

(56) References Cited

U.S. PATENT DOCUMENTS

| | | | |
|---|---|---|---|
| 6,627,555 B2 | 9/2003 | Eitan et al. | |
| 7,439,575 B2 | 10/2008 | Roizin et al. | |
| 7,646,643 B1 | 1/2010 | Lin | |
| 9,142,556 B2 | 9/2015 | Kito | |
| 9,202,696 B2 | 12/2015 | Yang et al. | |
| 9,607,123 B2 | 3/2017 | Zhang et al. | |
| 2001/0026970 A1* | 10/2001 | Eitan | H01L 27/0251 438/215 |
| 2013/0146981 A1 | 6/2013 | Yang et al. | |
| 2013/0237022 A1* | 9/2013 | Rogers | G11C 8/08 438/237 |
| 2015/0318273 A1 | 11/2015 | Lue et al. | |
| 2016/0276334 A1* | 9/2016 | Chang | H01L 27/0259 |

* cited by examiner

Primary Examiner — Fernando Hidalgo
(74) Attorney, Agent, or Firm — Fish & Richardson P.C.

(57) ABSTRACT

Systems, methods, circuits, and apparatus including computer-readable mediums for protecting memory cells from in-process charging effects for a memory system, e.g., NAND flash memory. The methods include: forming a first connection to connect a first node of a diode to a memory cell line coupled with one or more memory cells to be fabricated and a second connection to connect a second node of the diode to a control circuit, such that, during fabricating the memory, in-process charges accumulated on the memory cells are discharged to a ground via a conductive path formed by a first voltage caused by the in-process charges forward biasing the diode and then enabling the control circuit to conduct a current to the ground, and after fabricating the memory and during operating the memory, turning off the conductive path by reverse biasing the diode with a second voltage applied on the control circuit.

20 Claims, 12 Drawing Sheets

PROTECTING MEMORY CELLS FROM IN-PROCESS CHARGING EFFECTS

BACKGROUND

The antenna effect is an effect that can potentially cause yield and reliability problems during manufacturing of metal-oxide-semiconductor (MOS) integrated circuits. The substantial charge collected during processing can lead to possible damage to devices. Such in-process charging effects can be generated during plasma enhanced processing, such as high density plasma (HDP) and plasma enhanced chemical vapor deposition (PECVD) thin film depositions, and etching process during back end of line (BEOL).

In some cases, the plasma charging effect plays a critical role in silicon-oxide-nitride-oxide-silicon (SONOS) charge-trapping devices. In some flash memory devices, either PN diode protection or poly fuse protection is adopted. In some cases, convention complementary metal-oxide-semiconductor (CMOS) logic process use antenna rules (AR) to check an allowable ratio of metal gate to gate area. Once the checking result violate the AR, there are some ways to fix the violation, for example, changing routing layers to immediately connect a gate to the highest metal layers, adding a via near the gate to connect the gate to the highest layer, or adding a reverse diode that can be formed away from a transistor's source/drain, with an n+ implant in a p-substrate or with a p+ implant in an n-well.

SUMMARY

The present disclosure describes systems and techniques for protecting memory cells from in-process charging effects for a memory system, e.g., a non-volatile memory system such as NAND flash memory.

One aspect of the present disclosure features a method of protecting memory cells in a memory from in-process charging effects, including: forming a first connection to connect a first node of a diode to a memory cell line coupled with one or more memory cells to be fabricated and a second connection to connect a second node of the diode to a control circuit, such that, during fabricating the memory, in-process charges accumulated on the memory cells are discharged to a ground via a conductive path formed by a first voltage caused by the in-process charges forward biasing the diode and then enabling the control circuit to conduct a current to the ground; and after fabricating the memory and during operating the memory, turning off the conductive path by reverse biasing the diode with a second voltage applied on the control circuit.

The control circuit can include a transistor. The transistor can include one of a PMOS transistor and a PNP bipolar junction transistor (BJT). The transistor can include a source coupled to the second node of the diode, a drain coupled to the ground, and a gate. The gate of the transistor can be coupled to the ground through a capacitor. In some implementations, the first connection and the second connection are formed on a first metal layer. The method can further include: forming a subsequent second metal layer on the memory to complete the fabrication of the memory and on the control circuit to couple the gate of the transistor with the source of the transistor to disable the transistor.

In some implementations, the first connection and the second connection are formed on a first metal layer. The method can further include: forming a subsequent second metal layer on the memory to complete the fabrication of the memory and on the control circuit to form a third connection for applying the second voltage to the second node of the diode. The second metal layer can be a top metal layer of the memory.

The second voltage applied on the control circuit can be higher than an operation voltage applied on the memory cell line. The memory cell line can include one of a word line, a bit line, a source select line (SSL), and a ground select line (GSL). In some cases, the control circuit includes a plurality of transistors coupled in series between the diode and the ground, such that the voltage applied on the control circuit is distributed among the transistors.

In some cases, the method further includes: connecting a second diode between a second memory cell line including one or more second memory cells and the control circuit, such that, during fabricating the memory, second in-process charges accumulated on the second memory cells are discharged to the ground via a second conductive path formed by a third voltage caused by the second in-process charges forward biasing the second diode and then enabling the control circuit to conduct the current to the ground.

Another aspect of the present disclosure features a method of manufacturing a memory system, including: forming a first connection to connect a first node of a diode to a memory cell line of a memory and a second connection to connect a second node of the diode to a control circuit; forming one or more memory cells coupled to the memory cell line, wherein, during the forming of the memory cells, in-process charges accumulated on the memory cells are discharged to a ground via a conductive path formed by a first voltage caused by the in-process charges forward biasing the diode and then enabling the control circuit to conduct a current to the ground; and completing manufacturing the memory system, such that the conductive path is operable to be turned off by reverse biasing the diode with a second voltage applied on the control circuit.

The method can further include: forming connections to connect a first terminal of a transistor in the control circuit to the second node of the diode and a second terminal of the transistor to the ground, wherein the transistor is enabled to conduct the current during discharging the in-process charges.

In some cases, the first connection and the second connection are formed on a first metal layer, and completing manufacturing the memory system includes forming a subsequent second metal layer on the memory to complete the memory and on the control circuit to disable the transistor. The second metal layer can be a top metal layer of the memory. The first terminal of the transistor can be a source and the second terminal of the transistor is a drain, and forming the second metal layer on the control circuit can include forming a connection between the source of the transistor and a gate of the transistor to disable the transistor.

In some cases, the first connection and the second connection are formed on a first metal layer, and completing manufacturing the memory system includes forming a subsequent second metal layer on the memory to complete the memory and on the control circuit to form a connection for applying the second voltage to the second node of the diode.

The method can further include: arranging the diode in a memory driver coupled to the memory cell line, and arranging the control circuit externally to the memory and the memory driver. The method can further include: forming connections for coupling a second diode to a second memory cell line of the memory and to the control circuit, such that, during fabricating second memory cells for the second memory cell line, second in-process charges accumulated on the second memory cells are discharged to the ground via a second conductive path formed by a third voltage caused by the second in-process charges forward biasing the second diode and then enabling the control circuit to conduct the current to the ground. The method can further include: coupling a voltage input for receiving the second voltage to the second node of the diode through one or more transistors.

A further aspect of the present disclosure features an integrated circuit, including: a memory including: a memory cell array including a plurality of memory cells; a row or column decoder; and a plurality of memory cell lines connecting respective rows or columns of memory cells in the memory cell array to the row or column decoder; a plurality of diodes each having a first node connected to a respective memory cell line of the plurality of memory cell lines; and a discharge control circuit connected to a second node of each of the diodes, the discharge control circuit including a first portion formed in a first metal layer and a second portion formed in a second metal layer that overlies the first metal layer, the control circuit configured such that, in the absence of the second metal layer, the discharge control circuit would be operable to discharge in-process charges accumulated on the memory cells to a ground via a conductive path formed in the first metal layer, and with the second metal layer, the discharge control circuit is operable to turn off the conductive path by reverse biasing the diode with a voltage applied in the control circuit through the second metal layer.

The first portion can include a transistor operable to provide the conductive path from the second node to the ground. In some cases, the second portion includes a connection between the second node and a gate of the transistor. In some cases, the second portion includes a connection between an input terminal for the second voltage and the second node. The first portion can include a connection between the second node and a gate of the transistor. The second metal layer can be a top metal layer of the memory.

Implementations of the above techniques include methods, systems, circuits, computer program products and computer-readable media. In one example, a method can be performed by a controller coupled to a non-volatile memory and the method can include the above-described actions performed by the controller, e.g., the actions for protecting memory cells from in-process charging effects. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can be implemented for any type of controller to protect flash memory cells from in-process charge effects. A memory cell line, e.g., a word line, can be connected to a forward diode that can turn on a conductive path to prevent accumulating in-process charging before the highest metal forming on the memory cells. After the highest metal layer is formed, a control circuit can turn off the conductive path by a high voltage that can reversely bias the forward diode. That is, the control circuit can provide a conductive path to the ground to discharge the in-processing charges accumulated during fabricating the memory cells, e.g., before forming a top metal layer, and provide a voltage to keep the diode under reverse bias during normal operation of the memory. The techniques can be implemented by a size effective method, and each word line only needs a forward diode and all the forward diodes can share with one control circuit located at a periphery area of the memory system.

The techniques can be applied to various types of sensitive devices, e.g., memory transistors (or memory cells) and capacitors, or standard MOS devices, e.g., n-channel and/or p-channel transistors. The memory transistors can include SONOS transistors, floating gate transistors, nitride read only memory (NROM) transistors, or other non-volatile memory MOS devices that can store charges. The techniques can be applied to various memory types, such as SLC (single-level cell) devices, or MLC (multi-level cell) devices like 2-level cell devices or TLC (triple-level cell) devices. The techniques can be applied to various types of non-volatile memory systems, such as NAND flash memory, among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

DETAILED DESCRIPTION

As noted above, PN diode protection or poly fuse protection has been adopted to counter in-process charging effects. However, both techniques have limitations. For the PN diode protection, a word line WL operation voltage is restricted to only reverse a direction of a diode and must be lower than a breakdown voltage. Moreover, the PN diode only provides protection after the breakdown voltage, thus it cannot protect the device from medium-range voltages. For poly fuse protection, it is necessary to rupture a fuse before measurement. If the rupture bias is too large, it may disturb the device as well.

In addition, it is hard for flash memory to adopt the various techniques for correcting antenna rule violations in CMOS logic, as the flash memory has an array layout, a large array metal layer number, metal pitch limitation, and high operation voltage requirement that can exceed a reverse diode breakdown voltage.

To address these issues, a memory cell line, e.g., a word line, can be connected to a forward diode that can turn on a conductive path to prevent accumulating in-process charging before a top metal layer forming on the memory cells. The control circuit can provide a conductive path to the ground to discharge the in-processing charges accumulated during fabricating the memory cells, e.g., before forming the top metal layer, but provide a voltage to keep the diode under reverse bias condition during normal operation of the memory.

Figure 1A:
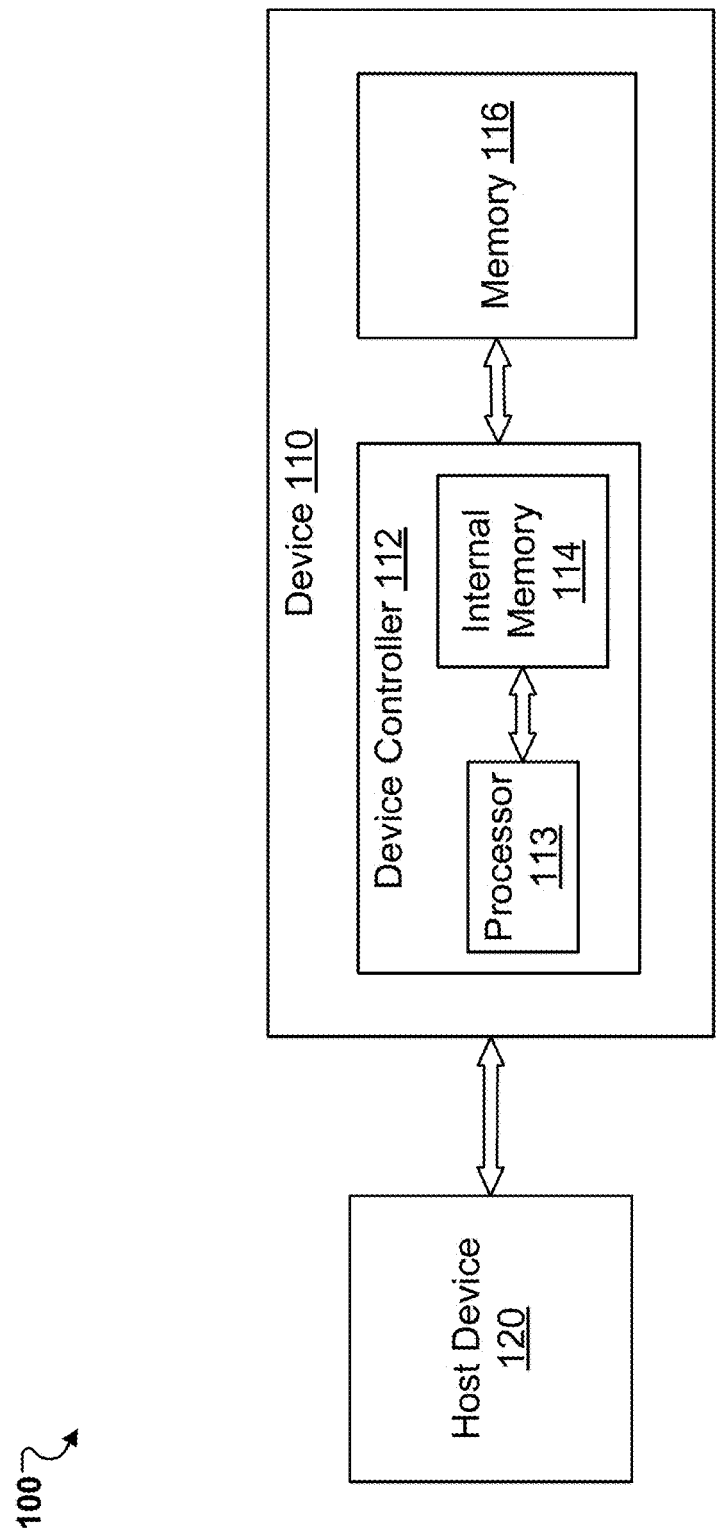
FIG. 1A illustrates an example of a system including a memory system, according to one or more implementations.

FIG. 1A illustrates an example of a system 100. The system 100 includes a device 110 and a host device 120. The device 110 can be a memory system including a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. For illustration purposes only, the following description uses a NAND flash memory as an example of the memory 116.

Figure 1B:
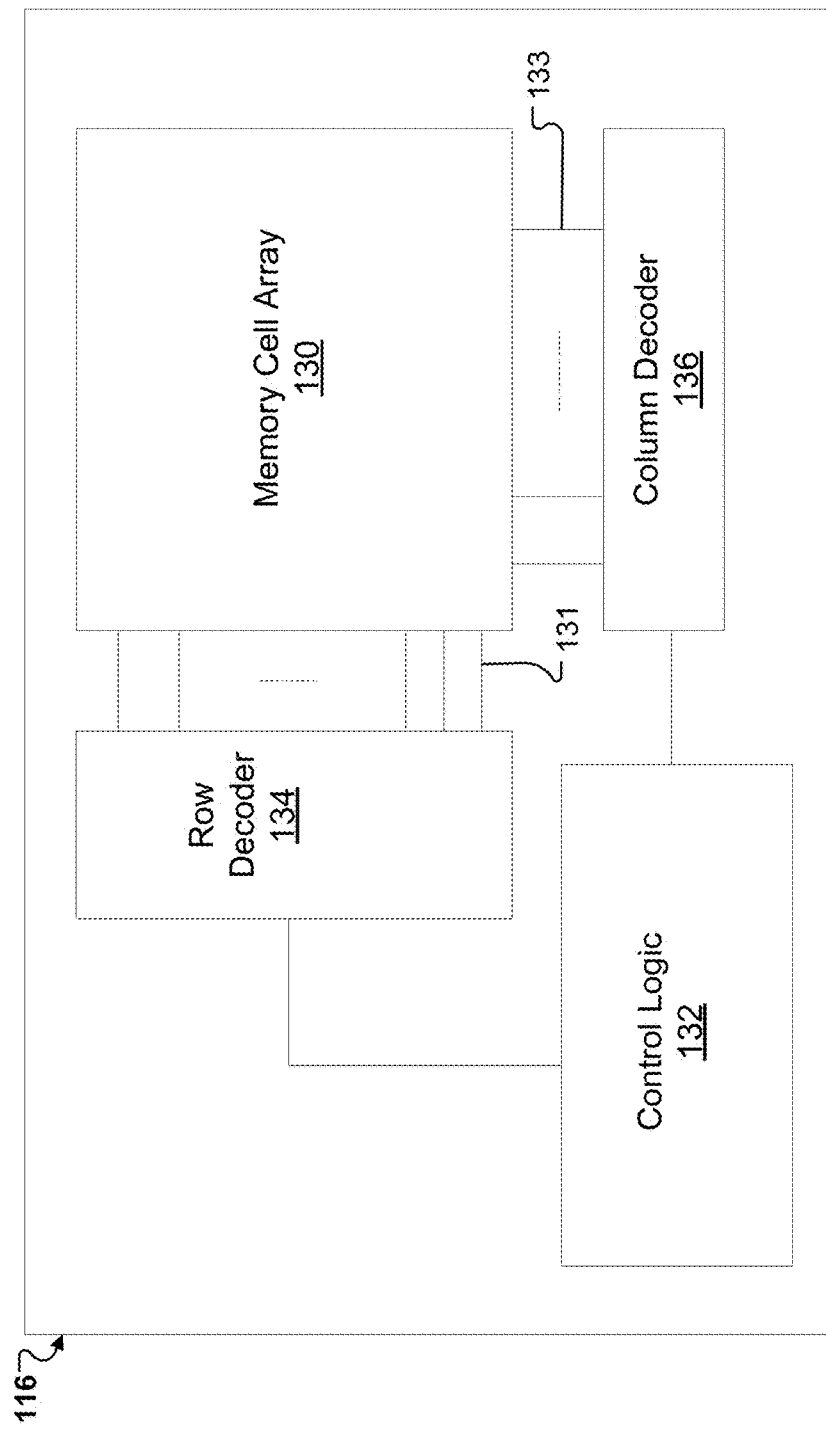
FIG. 1B illustrates an example memory, according to one or more implementations.

FIG. 1B illustrates an example configuration of the memory 116. The memory 116 includes a memory cell array 130, a control logic 132, a row decoder (or driver) 134, and a column decoder (or driver) 136. The memory cell array 130 can include a number of memory blocks.

Figure 1C:
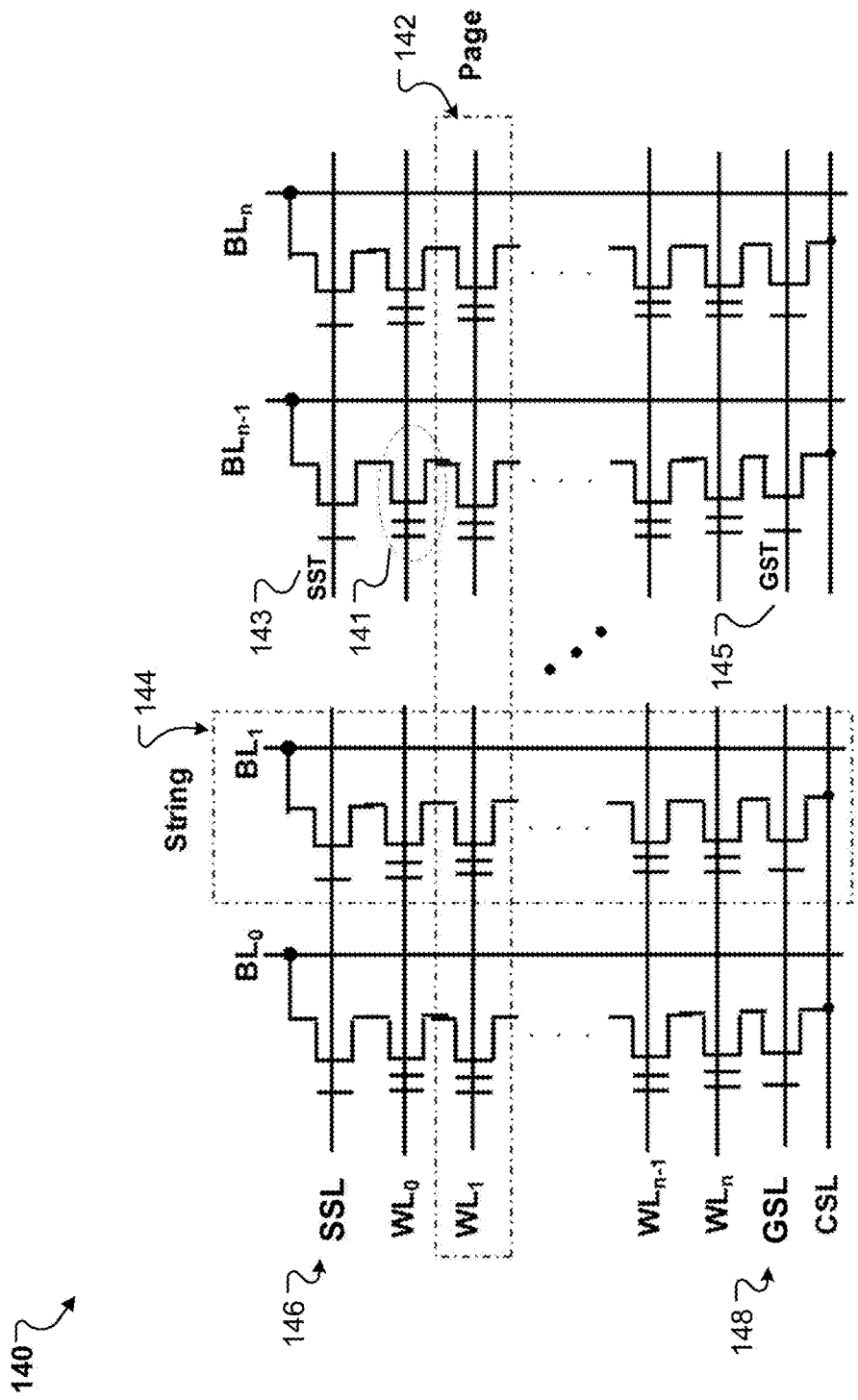
FIG. 1C illustrates an example two-dimensional (2D) memory block, according to one or more implementations.

FIG. 1C illustrates an example configuration of a two-dimensional (2D) memory block 140 of the memory cell array 130. The memory block 140 includes memory cells 141 that are coupled in series to column bit lines $BL_0$, $BL_1, \ldots, BL_{n-1}$, and $BL_n$ to form a number of cell strings 144, and to row word lines $WL_0, WL_1, \ldots, WL_{n-1}$, and $WL_n$ to form a number of cell pages 142.

Each memory cell is coupled to the row decoder 134 via a respective word line 131 and coupled to the column decoder 136 via a respective bit line 133 (see FIG. 1B). Accordingly, each memory cell can be selected for operation through the respective word line 131 and the respective bit line 133. The control logic 132 is connected to the row decoder 134 and the column decoder 136, e.g., via global word lines and global bit lines, and configured to control the memory cells through the row decoder 134 and the column decoder 136. The control logic 132 can be configured to receive commands and/or data signal from the device controller 112.

Referring back to FIG. 1C, a cell string 144 can include a number of memory cells 141, a source select transistor (SST) 143, and a ground select transistor (GST) 145, which are all connected in series. A gate of the SST 143 is connected to a source select line (SSL) 146. Gates of the SSTs in different strings are also connected to the same SSL. Gates of the memory cells 141 are respectively connected to word lines $WL_0, WL_1, \ldots, WL_{n-1}, WL_n$. The memory cells 141 are connected to a common source line (CSL) via the GST 145. A gate of the GST 145 is connected to a ground select line (GSL) 148. Gates of the GSTs in different strings are also connected to the same GSL. A cell page 142 can include a number of memory cells 141. Gates of the memory cells 141 in the cell page 142 are coupled in series to a respective word line (WL). When an input voltage is applied to the word line, the input voltage is also applied to all the gates of the memory cells 141 in the cell page 142.

A memory cell can include a memory transistor configured as a storage element. The memory transistor can include an SONOS transistor, a floating gate transistor, a nitride read only memory (NROM) transistor, or any suitable non-volatile memory MOS device that can store charges. During fabricating the memory cell, e.g., by plasma enhanced processing, in-process charging effects can be generated for the memory cell and in-process charges can be accumulated on the memory cell.

As discussed with further details in FIGS. 2A-2D, the accumulated in-process charges can be discharged to a ground through a forward diode and a control circuit during manufacturing of the memory 116. An anode of the forward diode is coupled to a memory cell line, e.g., a word line, and a cathode of the forward diode is coupled to the control circuit. After the memory 116 is completed and during normal operation of the memory 116, the forward diode is reversely biased by a voltage applied on the control circuit. The control circuit can be also disabled, i.e., current flow through the control circuit can be prevented, during normal operation of the memory 116. A respective forward diode can be configured for each word line, and all the respective forward diodes can be located in the row decoder 134 and share with one control circuit. In one example, the control circuit can be located in the control logic 132. In another example, the memory 116 is fabricated in a semiconductor chip, and the control circuit can be located at a periphery area of the semiconductor chip and external to the memory 116 and the row decoder 134.

For the 2D memory block 140, the SSTs 143 and the GSTs 145 are configured to function as switches and not as storage elements, thus the SSTs 143 and the GSTs 145 can include transistors that are not configured to store charges, different from the memory transistors. The SSTs 143 and the GSTs 145 in the 2D memory block 140 may not suffer from in-process charging effects.

Figure 1D:
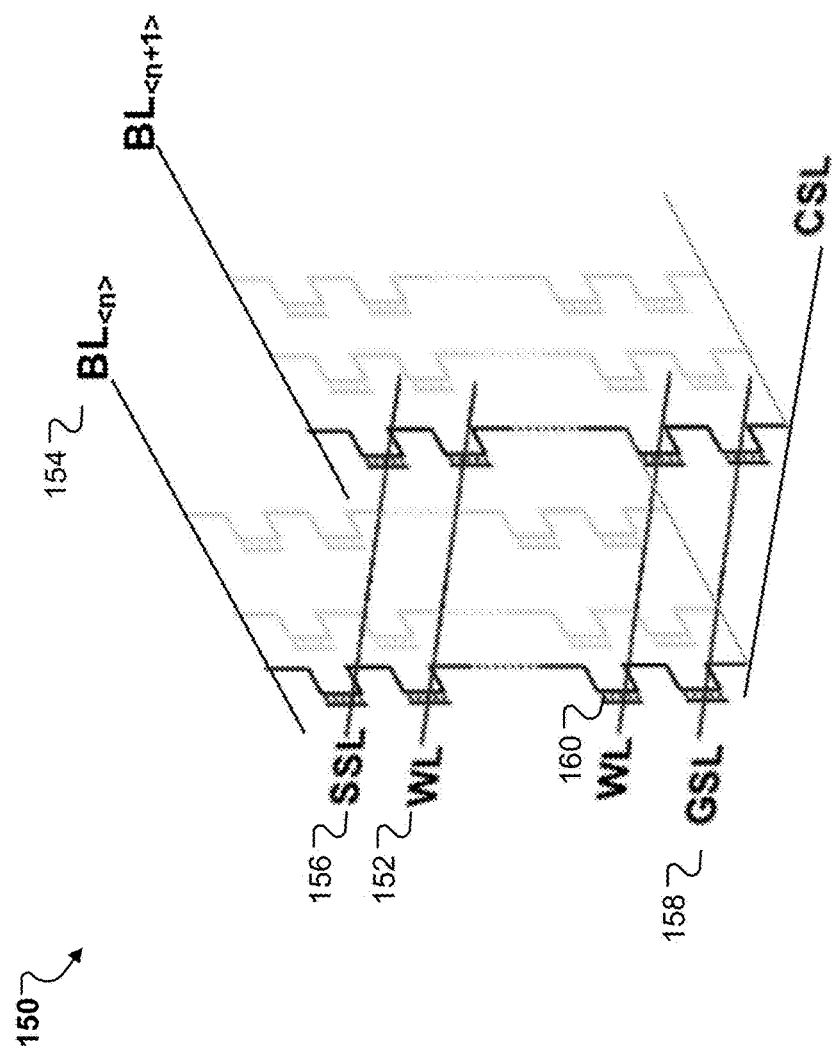
FIG. 1D illustrates an example three-dimensional (3D) memory block, according to one or more implementations.

In some implementations, the memory 116 is a three-dimensional (3D) memory. FIG. 1D illustrates an example 3D memory block 150 in the 3D memory. Memory cells 160 are arranged in three dimensions and coupled to a number of word lines 152 and a number of bit lines 154. As illustrated in FIG. 1D, in the 3D memory, memory cells 160 are configured as SSTs coupled to SSL 156 and GSTs coupled to GSL 158. As the memory cells 160 are storage elements that can store charges, in-process charging effects can also be generated at SSTs and GSTs during manufacturing the 3D memory. As discussed with further details in FIG. 3, the in-process charging effects can be discharged in a similar way to that shown in FIGS. 2A-2D.

Figure 2A:
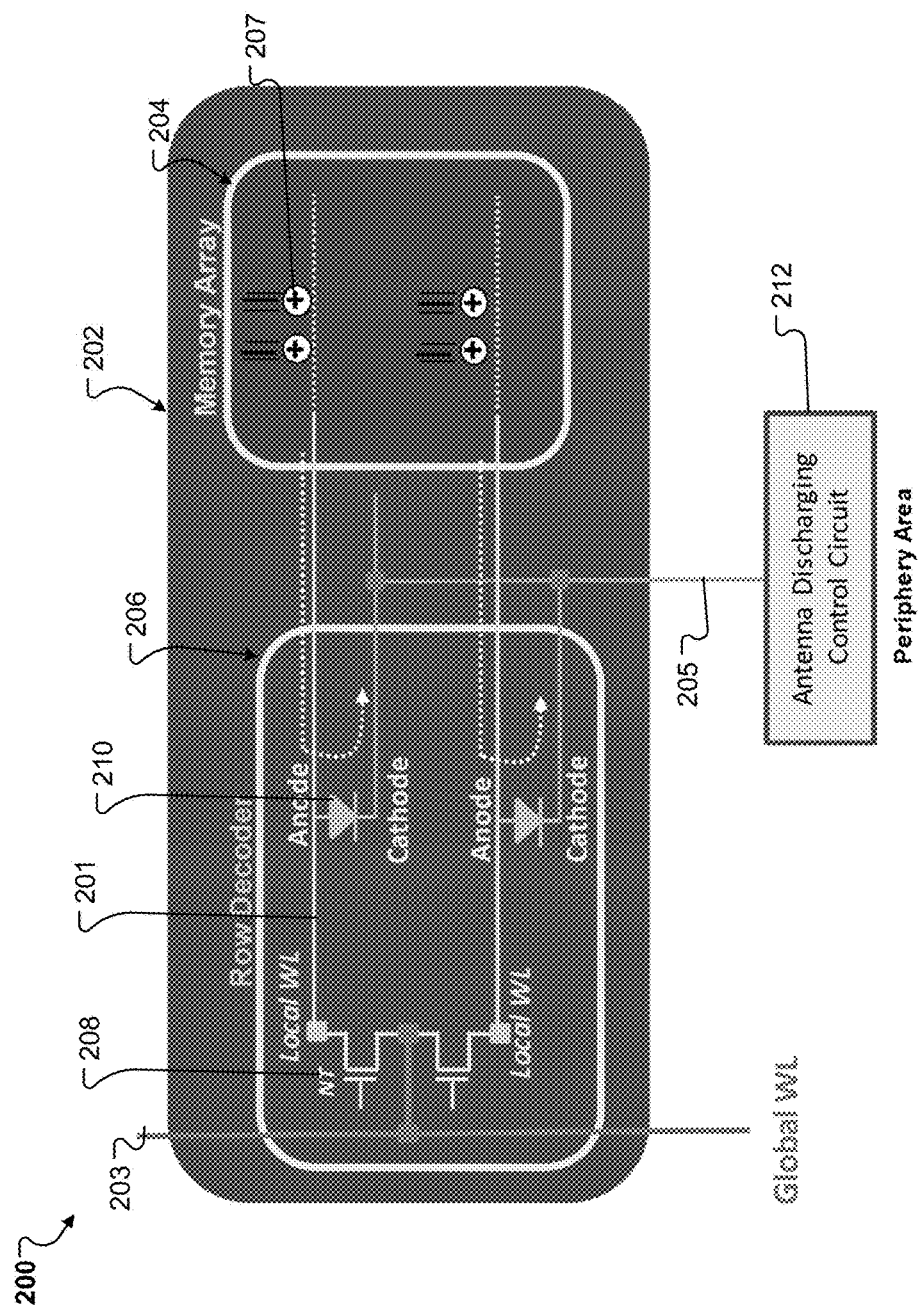
FIG. 2A shows an example diagram illustrating a memory system for protecting memory cells in word lines from in-process charges, according to one or more implementations.

FIG. 2A shows an example diagram illustrating a memory system 200 for protecting memory cells in word lines from in-process charges. The memory system 200 can be similar to the device 110 of FIG. 1A. The memory system 200 includes a memory 202, e.g., the memory 116 of FIGS. 1A-1B. The memory 202 can include a memory array 204, e.g., the memory array 130 of FIG. 1B, and a row decoder 206, e.g., the row decoder 134 of FIG. 1B.

Each local word line (WL) 201 is coupled with one or more memory cells in the memory array 204. In the row decoder 206, each local WL 201 is connected to a transistor 208, e.g., an NMOS transistor, that is configured to function as a switch to pass a signal from a corresponding global WL 203 to the local WL 201. The global WL 203 can be connected to a control logic of the memory 202, e.g., the control logic 132 of FIG. 1B.

To discharge in-process charges 207 accumulated on the memory cells in the memory array 204, a number of diodes 210 can be inserted into the row decoder 206, each diode 210 being connected to a respective local WL 201 of the memory array 204. An anode of the diode 210 is connected to the local WL 201 and a cathode of the diode 210 is connected to a common conductive line 205 that is connected to a control circuit 212, e.g., an antenna discharging control circuit. As discussed with further details in FIG. 2C, during manufacturing the memory 202, the in-process positive charges 207 generated or accumulated on the memory cells can be discharged through the forward diode 210 to the control circuit 212 that can be turned on, i.e., current flow through the control circuit is permitted, to discharge the in-process charges 207 to a ground (GND).

The memory system 200 can be fabricated on a semiconductor chip. The control circuit 212 can be fabricated at a periphery chip area of the memory system 200 and external to the memory 202 (or external to the memory array 204 and the row decoder 206). The control circuit 212 can be coupled to the ground, e.g., by positioning the control circuit 212 (or the semiconductor chip) on a chuck that is grounded. The chuck can include a p-type substrate.

Figure 2B:
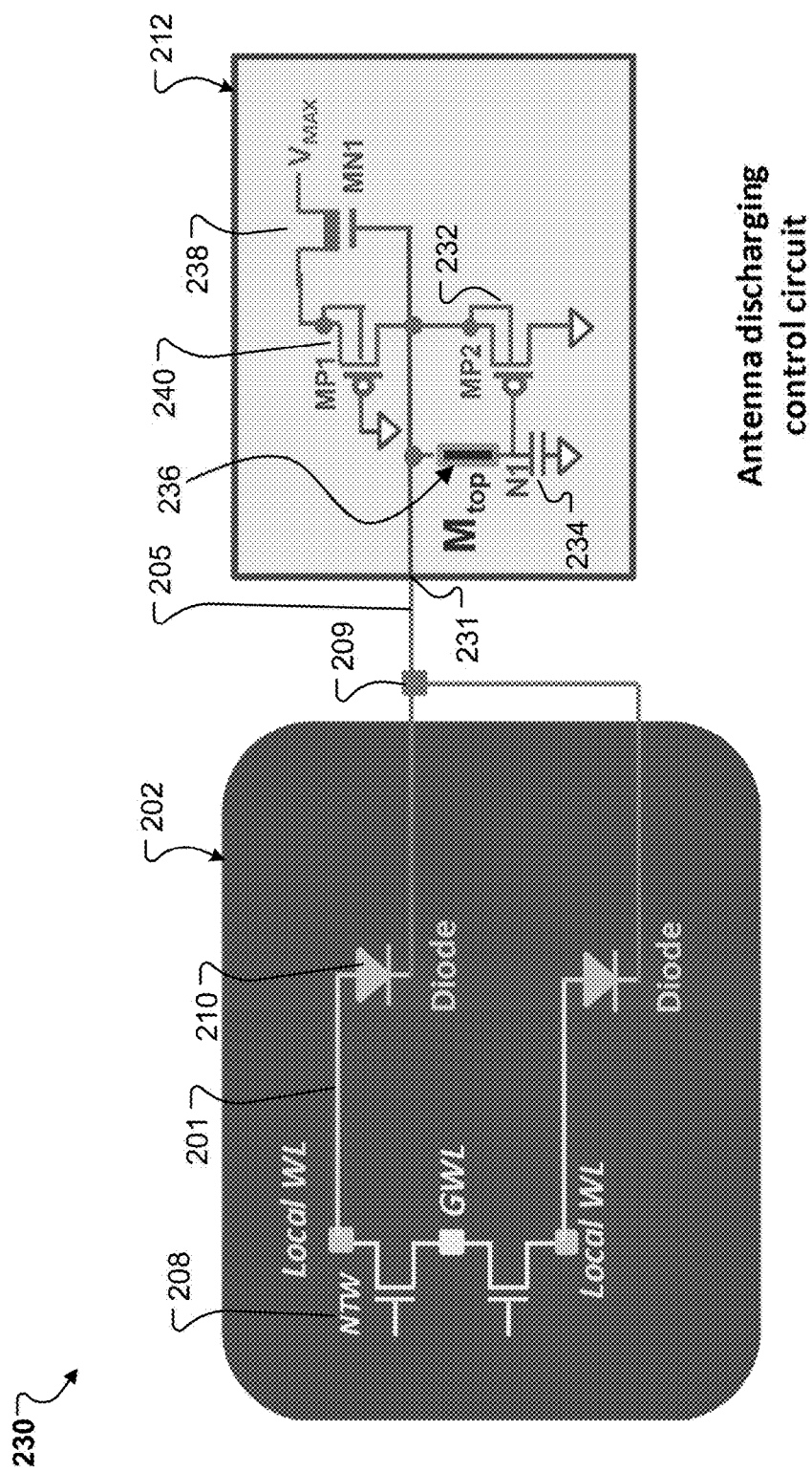
FIG. 2B shows an example diagram for protecting memory cells in word lines from in-process charges, according to one or more implementations.

FIG. 2B shows an example circuit diagram 230 with more details on the control circuit 212 for protecting memory cells coupled with word lines from in-process charges. The cathodes of the all inserted diodes 210 in the row decoder 206 can be connected to a common node 209 that is connected to an input node 231 of the control circuit 212. In some implementations, the control circuit 212 includes a transistor (MP2) 232. The transistor 232 can be a p-type transistor, e.g., a PMOS transistor or a PNP BJT. The transistor 232 includes a drain coupled to the ground, a source coupled to the input node 231 (thus to the common node 209 and to the cathodes of the diodes 210), and a gate. When a voltage difference $V_{SG}$ between the source and the gate is larger than a threshold voltage $V_{th}$ of the transistor 232, the transistor 232 can be turned on to conduct a current from the source to the drain (thus to the ground). In some examples, the gate of the transistor 232 is coupled to the ground via a capacitor (N1) 234. In some examples, the gate of the transistor 232 is floating.

Inside the control circuit 212, a portion of connections, including the connection from the source of the transistor 232 to the input node 231, is formed by a first metal layer on the semiconductor chip. The first metal layer can be the bottom metal layer, i.e., the metal layer closest the substrate. The connections between the local word lines 201 and the diodes 210 and between the diodes 210 and the transistor 232 can be formed before fabricating memory cells in the memory array 204, such that, during fabricating the memory cells, in-process charges generated or accumulated on the memory cells can be discharged, e.g., gradually and continuously, to the ground via a conductive path formed by the diodes 210 and the transistor 232.

There can be more than one metal layer in the semiconductor chip. Each metal layer is separated from the others by an insulation layer. For example, over a first metal layer, there can be an insulating layer followed by a second, metal layer. Electrical connection between the first metal layer and the second metal layer can be made using via connections.

A subsequent second metal processing step (i.e., after the process that deposits the first metal layer) can deposit a second metal layer on the memory 202 to complete fabrication of the memory 202. The second metal processing can also deposit the second metal layer on the control circuit to form a connection line ($M_{top}$) 236 for connecting the gate of the transistor 232 (and/or the capacitor 234) to the source of the transistor 232. The second metal layer can be the top metal layer of the memory 202 (or an integrated circuit including the memory 202). In some cases, the connection line 236 can be formed by another metal layer other than the top metal layer, e.g., a latest metal layer under the top metal layer.

Before the second metal processing, a connection node of the capacitor 234 is floating, such that the transistor 232 can be turned on by a voltage caused by accumulated in-process charges on the memory cells, thereby turning on the conductive path for discharging the in-process charges to the ground.

After the second metal processing step, the connection line 236 is formed, which connects the gate of the transistor 232 to the source of the transistor 232. Then the transistor 232 is turned off, and the conductive path for discharging to the ground is turned off.

A voltage $V_{MAX}$ can be applied on the control circuit 212. The voltage $V_{MAX}$ can be applied to the input node 231, such that the diodes 210 are reversed biased and isolate the word lines from the control circuit 212. The voltage $V_{MAX}$ can have a voltage level larger than a maximum operation bias voltage applied on the word lines 201 to keep the diodes 210 under the reverse bias condition. Thus, during normal operation, the control circuit 212 can have no or little effect on the memory 202.

In some implementations, the voltage $V_{MAX}$ is applied to the input node 231 via at least one transistor, e.g., a NMOS transistor (MN1) 238 and a PMOS transistor (MP1) 240. The transistor 238 includes a drain coupled to an input for receiving the voltage $V_{MAX}$, a gate coupled to the input node 231, and a source coupled to a source of the transistor 240. A gate of transistor 240 is coupled to the ground, and a drain of the transistor 240 is coupled to the input node 231. In such a way, when $V_{MAX}$ is applied, the transistors 238 and 240 are turned on to convey the voltage to the input node 231 and thus to the cathodes of the diodes 210.

In some examples, connections between the transistors 238 and 240 and the input node 231 can be formed on the same metal layer as the connections between the transistor 232 and the input node 231. In some examples, the connections between the transistors 238 and 240 and the input node 231 can be formed during fabricating the memory array 204, before the second metal processing, or after the second metal processing. The voltage $V_{MAX}$ can be applied on the control circuit after the second metal processing, e.g., during normal operation of the memory 202.

Figure 2C:
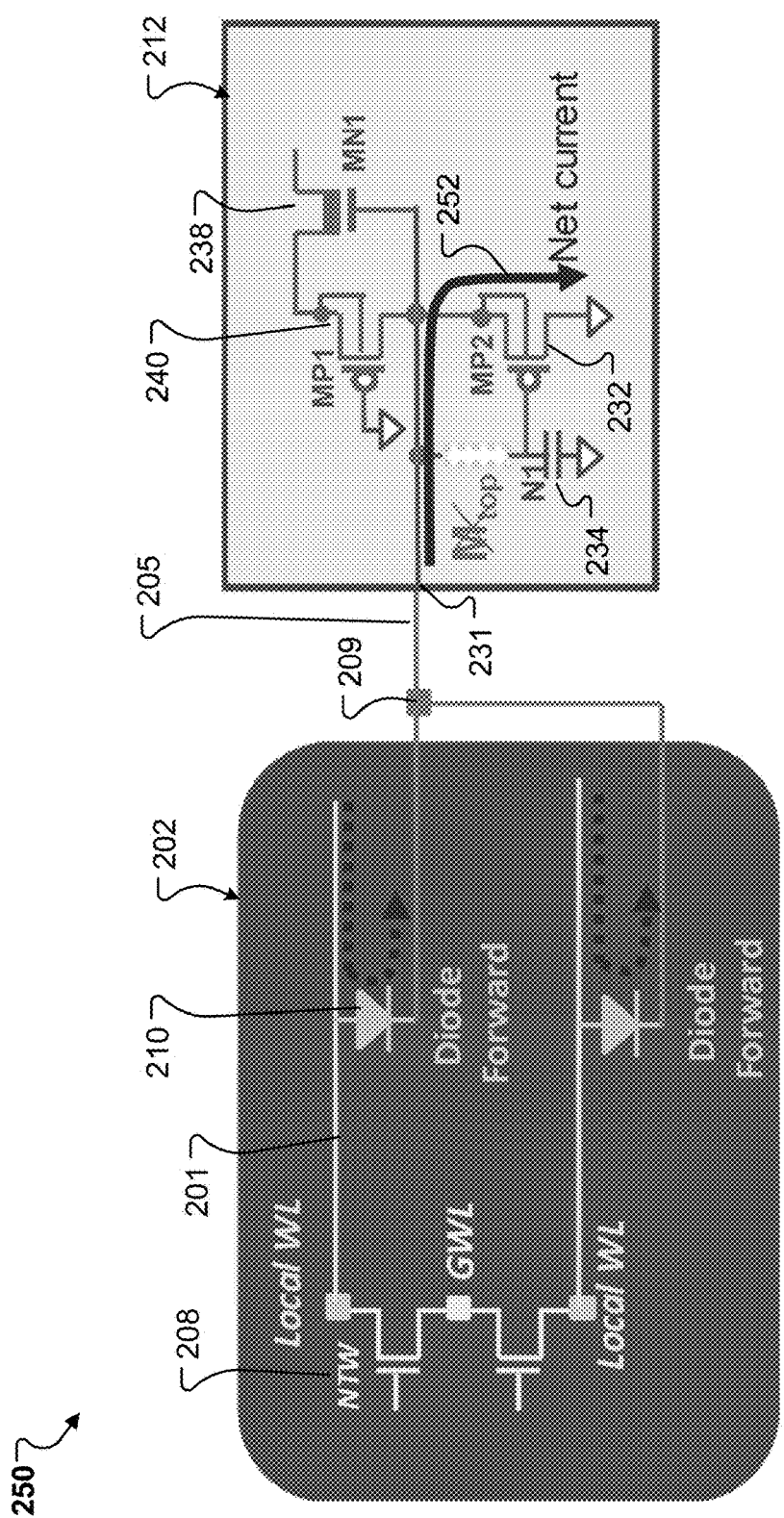
FIG. 2C shows an example diagram for discharging in-process charges from the word lines during fabricating the memory system of FIG. 2A, according to one or more implementations.

FIG. 2C shows an example diagram 250 for discharging in-process charges from the word lines during fabricating the memory 202. During the in-process charge discharge phase and before the second metal processing, there is no connection line 236 but all the other connections in the control circuit 212 are formed, e.g., by a bottom metal layer. When a voltage caused by the in-process charging on the memory cells is larger than a threshold voltage Vth of the diode 210, e.g., 0.7 volts for silicon based diodes or 0.3 volts for germanium based diodes, the diode 210 is forward biased to conduct the in-processing charges to the control circuit 212; When a voltage at the common node 209 is larger than a threshold voltage of the transistor 232, the transistor 232 is turned on to conduct current to the ground. Thus, a discharge to ground path 252 can be formed to discharge the in-processing positive charge to the ground.

Figure 2D:
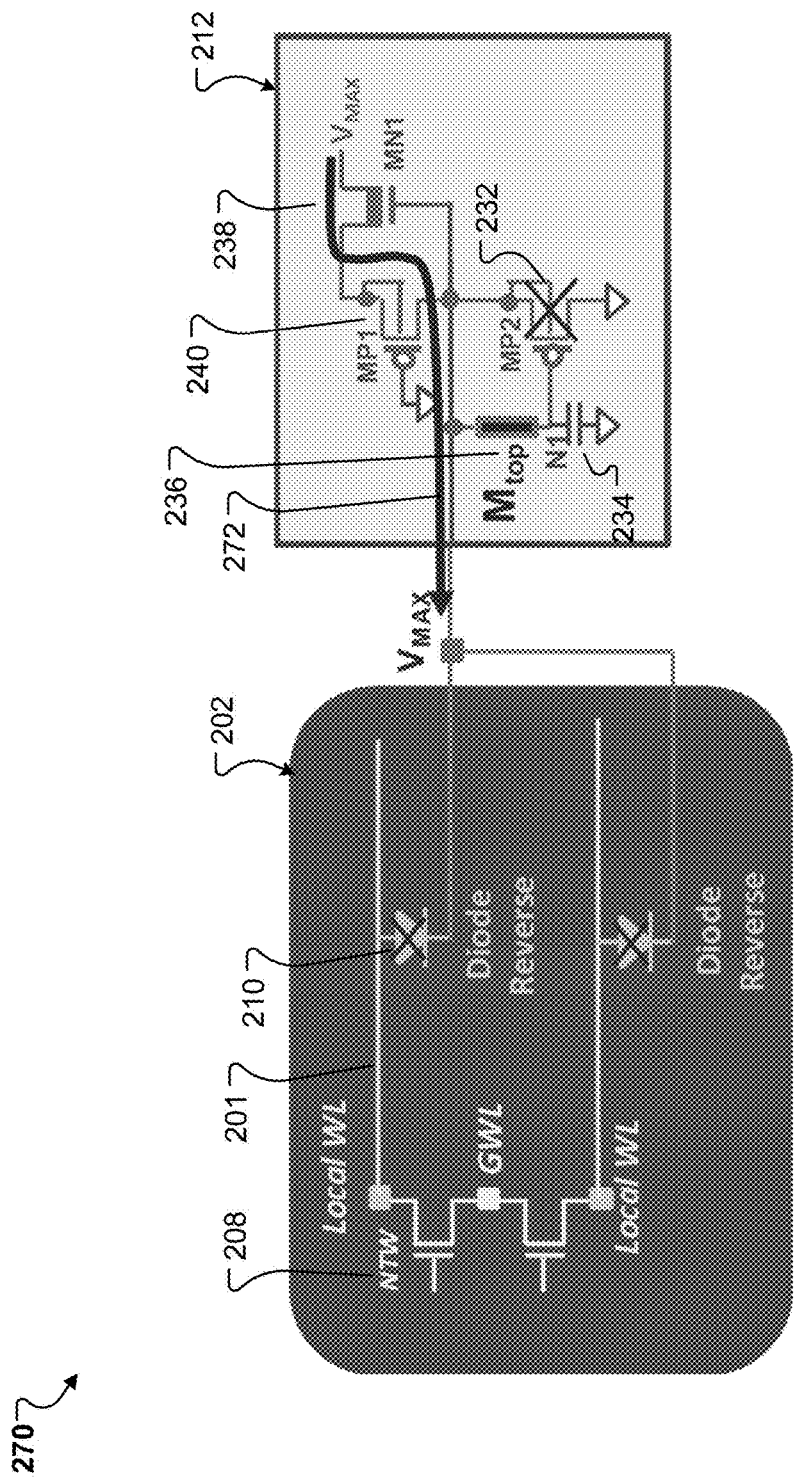
FIG. 2D shows an example diagram for operating the memory system of FIG. 2A, according to one or more implementations.

FIG. 2D shows an example diagram 270 for operating the memory 202. As noted above, after the second metal processing and during normal operation of the memory 202, connection line 236 is formed to connect the gate of the transistor 232 to the source of the transistor 232 to thereby turn off the transistor 232. The control circuit 212 can provide a high voltage $V_{MAX}$ 272 to put the diodes 210 under a reverse bias condition.

Figure 3:
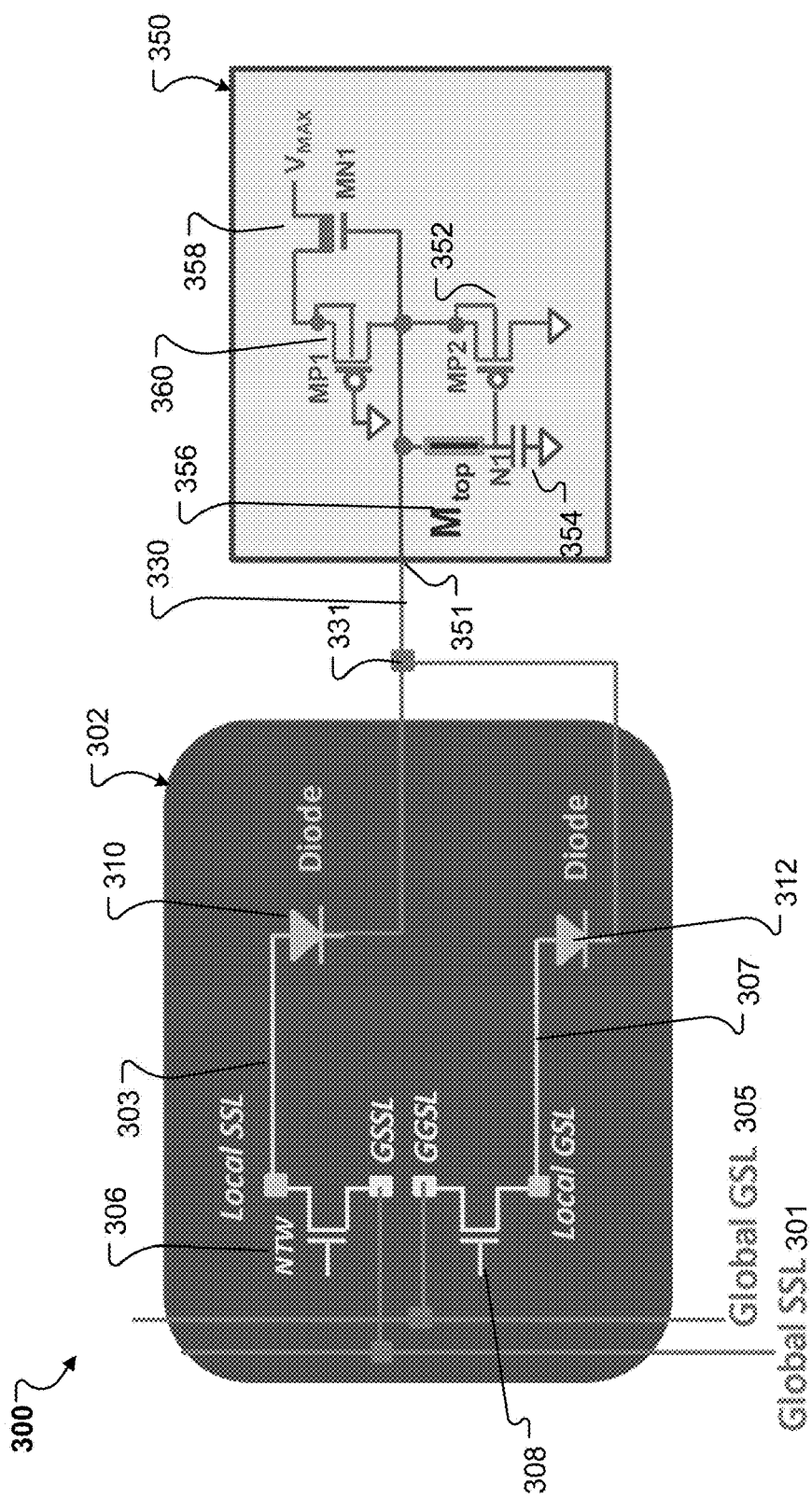
FIG. 3 shows an example diagram of a memory system for protecting memory cells coupled to source select lines (SSLs) and ground select lines (GSLs) from in-process charges, according to one or more implementations.

FIG. 3 shows an example diagram of a memory system 300 for protecting memory cells coupled to source select lines (SSLs) and ground select lines (GSLs) from in-process charges.

In a row decoder of a memory 302 in the memory system 300, each local SSL 303 is connected to a transistor 306, e.g., an NMOS transistor, that is configured to function as a switch to pass a signal from a corresponding global SSL 301 to the local SSL 303. Each local GSL 307 is connected to a transistor 308, e.g., an NMOS transistor, that is configured to function as a switch to pass a signal from a corresponding global GSL 305 to the local GSL 307. The global SSL 301 and GSL 305 can be connected to a control logic of the memory 302, e.g., the control logic 132 of FIG. 1B.

As illustrated in FIG. 1D, in a 3D memory system, SSTs and GSTs coupled to the local SSL 303 and the local GSL 307 can be also formed by memory cells. Thus, in-process charging effects can also be generated on the SSTs and GSTs (thus on SSL 303 and GSL 307), similar to memory cells in a memory cell array, e.g., the memory cell array 204 of FIG. 2A. The in-process charging effects can cause an initial threshold voltage of SSL (or SST) and GSL (or GST) to be too high. SSL/GSL erase operation can be applied to discharge the in-processing charging, however, after the erase operation, the SSL/GSL threshold voltage can become too low, which may cause leakage issue.

Similar to the memory system 200, returning to FIG. 3, in the memory system 300, an anode of a first diode 310 can be coupled to the local SSL 303, and an anode of a second diode 312 can be coupled to the local GSL 307. Cathodes of the first diode 310 and the second diode 312 are coupled to a common node 331 that is connected to an input node 351 of a control circuit 350. The control circuit 350 can be the similar to the control circuit 212 of FIG. 2B. The control circuit 350 can include a transistor (MP2) 352, e.g., the transistor 332 of FIG. 2B. The transistor 352 includes a source coupled to the input node 351, a drain coupled to a ground, and a gate coupled to the ground via a capacitor 354.

During fabricating the memory 302 and before top metal processing, in-process charges generated on SSTs and GSTs coupled with the local SSL 303 and local GSL 307 can be discharged to the ground by a conductive path formed by the diode 310 in a forward biased condition and the transistor 352 in a turned-on state. After the top metal processing, connection line ($M_{top}$) 356 is formed to connect the source of the transistor to the gate of the transistor 352, which can turn off the transistor 352. During normal operation of the memory system 300, a voltage $V_{MAX}$ can be applied on the control circuit 350 to thereby reversely bias the diodes 310 and 312 through transistor 358, e.g., the transistor 238 of FIG. 2B, and transistor 360, e.g., the transistor 240 of FIG. 2B.

In some implementations, in the memory system 300, a respective diode can be inserted into the row decoder to couple to each word line to discharge in-process charges generated on memory cells in the word line to the ground through the control circuit 350. In some implementations, no diode is inserted for the word lines. Instead, the in-process charges on the memory cells can be discharged during an erase operation on the memory cells during normal operation.

Figure 4:
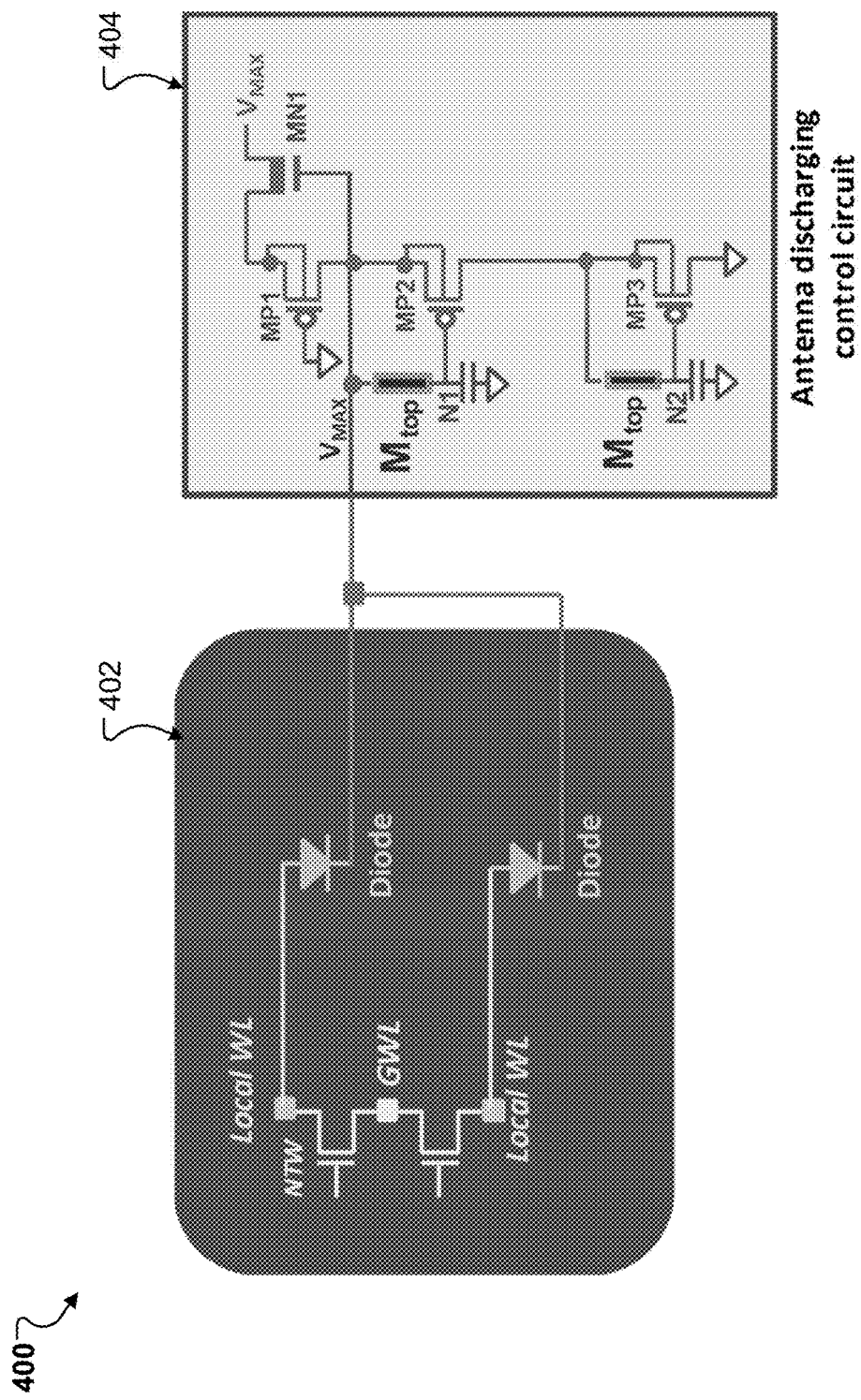
FIG. 4 shows an example diagram of another memory system, according to one or more implementations.

FIG. 4 shows an example diagram illustrating another memory system 400 for protecting memory cells in word lines from in-process charges. The memory system 400 includes a memory 402, similar to the memory 202 of FIG. 2B, where a respective diode can be coupled to each word line in a row decoder. The memory system includes a control circuit 404 coupled to cathodes of the diodes. Compared to the control circuit 212 of FIG. 2B, the control circuit 404 includes multiple transistors coupled in series between an input node of the control circuit 212 and a ground.

As noted above, a voltage $V_{MAX}$ needs to be higher than a maximum operation voltage applied on the word lines, e.g., about 24 Volts, to put the diodes under a reverse bias condition. Thus, during normal operation, transistor MP2, e.g., the transistor 232 of FIG. 2B, in the control circuit 404 may suffer from a high stress voltage from $V_{MAX}$. With an additional transistor MP3, the voltage can be divided between the transistors MP2 and MP3, and thus, the stress voltage on each of the transistors MP2 and MP3 is reduced.

Figure 5:
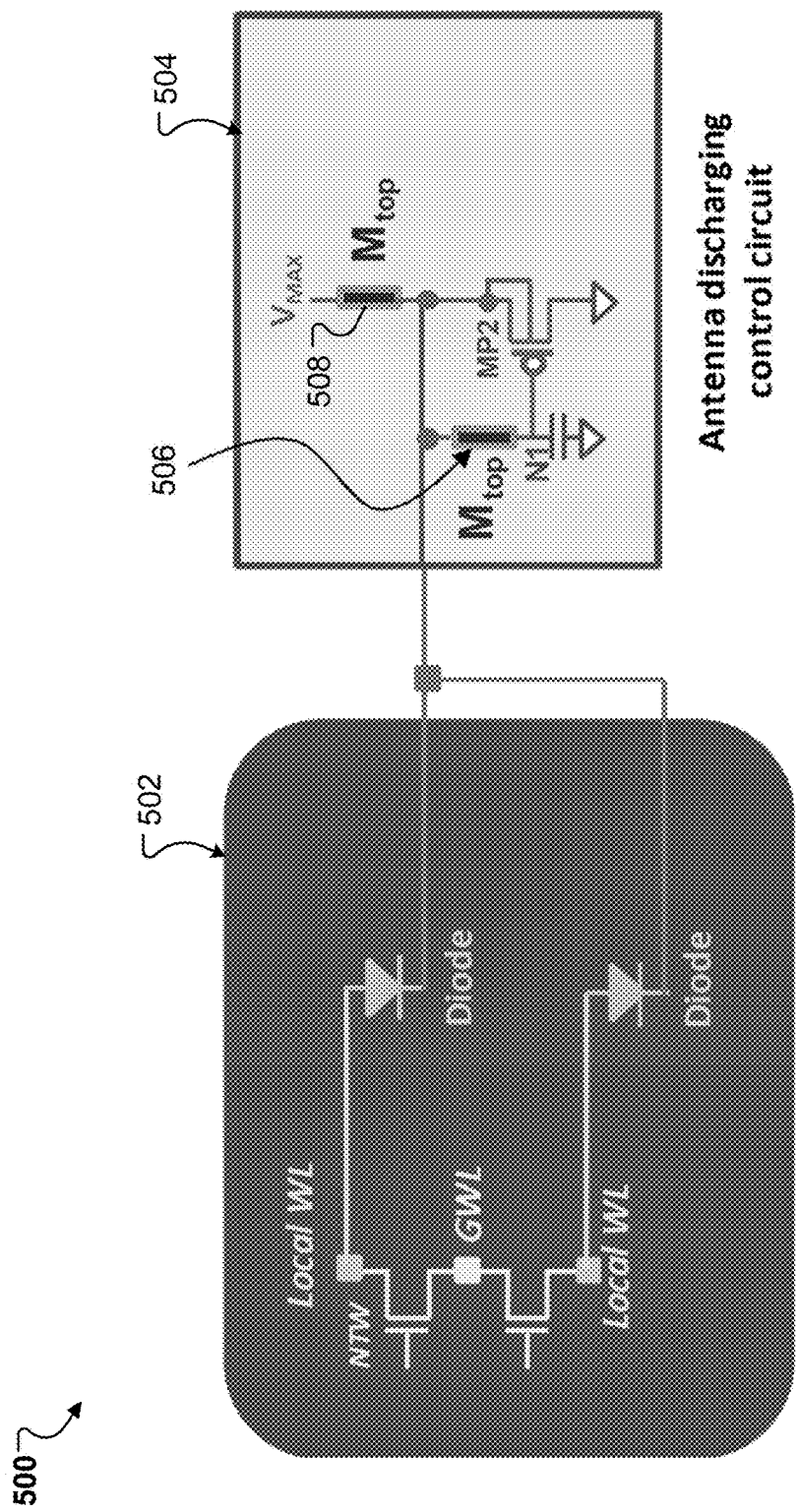
FIG. 5 shows an example diagram of a further example memory system, according to one or more implementations.

FIG. 5 shows an example diagram illustrating another memory system 500 for protecting memory cells in word lines from in-process charges. The memory system 500 includes a memory 502, similar to the memory 202 of FIG. 2B, where a respective diode can be coupled to each word line in a row decoder.

The memory system 500 includes a control circuit 504 coupled to cathodes of the diodes. Compared to the control circuit 212 of FIG. 2B, in the control circuit 504, a voltage $V_{MAX}$ can be coupled to the diodes using a metal connection line 508, instead of transistors. The metal connection line 508 can be formed during top metal processing, similar to a connection line 506 (e.g., the connection line 236 of FIG. 2B) for connecting a source of transistor MP2 to a gate of transistor MP2.

Figure 6:
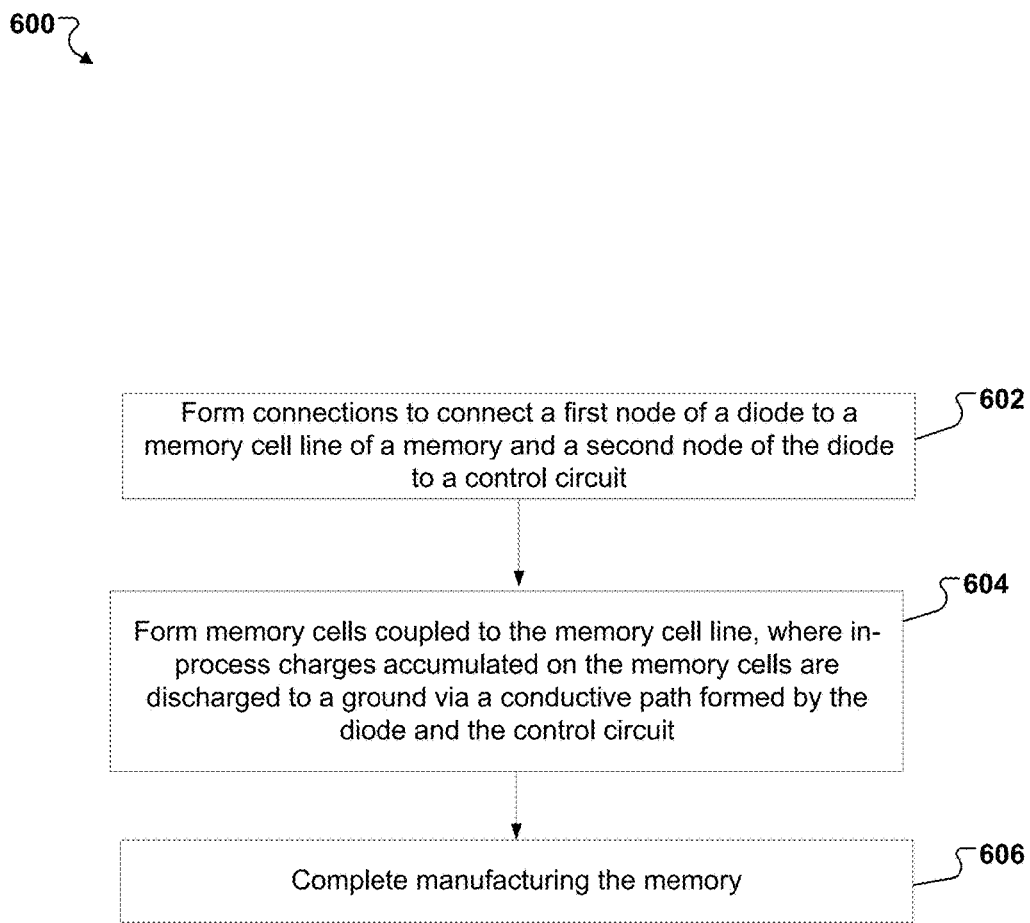
FIG. 6 illustrates an example of a process for protecting memory cells from in-process charging effects, according to one or more implementations.

FIG. 6 illustrates an example of a process 600 for protecting memory cells from in-process charging effects, according to one or more implementations.

Connections are formed to connect a first node of a diode to a memory cell line of a memory and a second node of the diode to a control circuit (602). The connections can be formed by a metal layer, e.g., a bottom metal layer, before fabricating the memory. The memory can be the memory 116 of FIG. 1B. The memory cell line is configured to be coupled with one or more memory cells to be fabricated. The memory cell line can be one of a word line, a bit line, a source select line (SSL), and a ground select line (GSL).

In some implementations, a number of diodes are inserted into a memory driver, e.g., a row decoder, and each diode is coupled with a respective memory cell line, e.g., a word line. Cathodes of the diodes can be connected to a common node coupled to an input node of the control circuit. The control circuit can be arranged on a periphery chip area and external to the memory driver and the memory.

The control circuit can include a transistor that can include one of a PMOS transistor and a PNP bipolar junction transistor (BJT). The process 600 can further include forming connections to connect a source of the transistor to the second node of the diode and a drain coupled to the ground. In some cases, the gate of the transistor is floating. In some cases, a connection can be formed to connect a gate of the transistor to the ground through a capacitor.

Memory cells are formed and coupled to the memory cell line (604). During forming the memory cells, in-process charges are accumulated on the memory cells. When a voltage caused by the in-process charges is large enough, e.g., larger than a threshold voltage of the diode and a threshold voltage of the transistor in the control circuit, a conductive path can be formed by the forward biased diode and the enabled transistor to discharge the in-process charges to the ground.

Manufacturing the memory is completed (606), such that the conductive path is operable to be turned off by reverse biasing the diode with a voltage applied on the control circuit. The voltage applied on the control circuit is higher than an operation voltage applied on the memory cell line to put the diode under reverse bias condition.

In some examples, completing manufacturing the memory includes forming a top metal layer on the memory, e.g., by top metal processing, to complete the memory. The top metal layer can be also formed on the control circuit to disable the transistor, e.g., by forming a connection between the source of the transistor and the gate of the transistor. In some examples, completing manufacturing the memory includes forming the top metal layer on the control circuit to form a connection for applying the voltage to the second node of the diode. The voltage can be also applied to the second node of the diode through one or more transistors.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method of protecting memory cells in a memory from in-process charging effects, comprising:
    forming a first connection to connect a first node of a diode to a memory cell line coupled with one or more memory cells to be fabricated and a second connection to connect a second node of the diode to a control circuit, such that, during fabricating the memory, in-process charges accumulated on the memory cells are discharged to a ground via a conductive path formed by a first voltage caused by the in-process charges forward biasing the diode and then enabling the control circuit to conduct a current to the ground, wherein the first connection and the second connection are formed on a first metal layer;
    forming a subsequent second metal layer that overlies on the first metal layer to complete the fabrication of the memory, wherein the control circuit is operable to discharge the in-process charges via the conductive path in the absence of the second metal layer and to turn off the conductive path with the second metal layer; and
    after fabricating the memory and during operating the memory, turning off the conductive path by reverse biasing the diode with a second voltage applied on the control circuit.

2. The method of claim 1, wherein the control circuit comprises a transistor.

3. The method of claim 2, wherein the transistor comprises a source coupled to the second node of the diode, a drain coupled to the ground, and a gate.

4. The method of claim 3, wherein
    the subsequent second metal layer on the memory is formed on the control circuit to couple the gate of the transistor with the source of the transistor to disable the transistor.

5. The method of claim 1, wherein
    the subsequent second metal layer on the memory is formed on the control circuit to form a third connection for applying the second voltage to the second node of the diode.

6. The method of claim 1, wherein the second voltage applied on the control circuit is higher than an operation voltage applied on the memory cell line.

7. The method of claim 1, wherein the memory cell line comprises one of a word line, a bit line, a source select line (SSL), and a ground select line (GSL).

8. The method of claim 1, wherein the control circuit comprises a plurality of transistors coupled in series between the diode and the ground, such that the voltage applied on the control circuit is distributed among the transistors.

9. The method of claim 1, further comprising:
    connecting a second diode between a second memory cell line including one or more second memory cells and the control circuit, such that, during fabricating the memory, second in-process charges accumulated on the second memory cells are discharged to the ground via a second conductive path formed by a third voltage caused by the second in-process charges forward biasing the second diode and then enabling the control circuit to conduct the current to the ground.

10. A method of manufacturing a memory system, comprising:
    forming a first connection to connect a first node of a diode to a memory cell line of a memory and a second connection to connect a second node of the diode to a control circuit, the first connection and the second connection being formed on a first metal layer;
    forming one or more memory cells coupled to the memory cell line, wherein, during the forming of the memory cells, in-process charges accumulated on the memory cells are discharged to a ground via a conductive path formed by a first voltage caused by the in-process charges forward biasing the diode and then enabling the control circuit to conduct a current to the ground; and
    forming a second metal layer overlying the first metal layer to complete manufacturing the memory system, such that the control circuit is operable to discharge the in-process charges via the conductive path in the absence of the second metal layer and to turn off the conductive path with the second metal layer by reverse biasing the diode with a second voltage applied on the control circuit.

11. The method of claim 10, further comprising:
    forming connections to connect a first terminal of a transistor in the control circuit to the second node of the diode and a second terminal of the transistor to the ground, wherein the transistor is enabled to conduct the current during discharging the in-process charges.

12. The method of claim 11,
wherein the subsequent second metal layer is formed on the control circuit to disable the transistor.

13. The method of claim 12, wherein the first terminal of the transistor is a source and the second terminal of the transistor is a drain, and
wherein the second metal layer is formed on the control circuit to form a connection between the source of the transistor and a gate of the transistor to disable the transistor.

14. The method of claim 10,
wherein the subsequent second metal layer is formed on the control circuit to form a connection for applying the second voltage to the second node of the diode.

15. The method of claim 10, further comprising:
forming connections for coupling a second diode to a second memory cell line of the memory and to the control circuit, such that, during fabricating second memory cells for the second memory cell line, second in-process charges accumulated on the second memory cells are discharged to the ground via a second conductive path formed by a third voltage caused by the second in-process charges forward biasing the second diode and then enabling the control circuit to conduct the current to the ground.

16. An integrated circuit, comprising:
a memory including:
a memory cell array comprising a plurality of memory cells;
a row or column decoder; and
a plurality of memory cell lines connecting respective rows or columns of memory cells in the memory cell array to the row or column decoder;
a plurality of diodes each having a first node connected to a respective memory cell line of the plurality of memory cell lines; and
a discharge control circuit connected to a second node of each of the diodes, the discharge control circuit including a first portion formed in a first metal layer and a second portion formed in a second metal layer that overlies the first metal layer, the control circuit configured such that
in the absence of the second metal layer, the discharge control circuit would be operable to discharge in-process charges accumulated on the memory cells to a ground via a conductive path formed in the first metal layer, and
with the second metal layer, the discharge control circuit is operable to turn off the conductive path by reverse biasing the diode with a voltage applied in the control circuit with the second metal layer.

17. The integrated circuit of claim 16, wherein the first portion comprises a transistor operable to provide the conductive path from the second node to the ground.

18. The integrated circuit of claim 17, wherein the second portion comprises a connection between the second node and a gate of the transistor.

19. The integrated circuit of claim 17, wherein the second portion comprises a connection between an input terminal for the second voltage and the second node.

20. The integrated circuit of claim 19, wherein the first portion comprises a connection between the second node and a gate of the transistor.

* * * * *